United States Patent
Lan et al.

(10) Patent No.: US 10,090,159 B2
(45) Date of Patent: Oct. 2, 2018

(54) CHEMICAL-MECHANICAL POLISHING COMPOSITIONS COMPRISING ONE OR MORE POLYMERS SELECTED FROM THE GROUP CONSISTING OF N-VINYL-HOMOPOLYMERS AND N-VINYL COPOLYMERS

(71) Applicant: BASF SE, Ludwigshafen (DE)

(72) Inventors: Yongqing Lan, Ludwigshafen (DE); Peter Przybylski, Ludwigshafen (DE); Zhenyu Bao, Potsdam, NY (US); Julian Proelss, Worms (DE)

(73) Assignee: BASF SE, Ludwigshafen (DE)

( * ) Notice: Subject to any disclaimer, the term of this patent is extended or adjusted under 35 U.S.C. 154(b) by 84 days.

(21) Appl. No.: 14/768,825

(22) PCT Filed: May 5, 2014

(86) PCT No.: PCT/IB2014/061200
§ 371 (c)(1),
(2) Date: Aug. 19, 2015

(87) PCT Pub. No.: WO2014/184702
PCT Pub. Date: Nov. 20, 2014

(65) Prior Publication Data
US 2015/0380263 A1 Dec. 31, 2015

(30) Foreign Application Priority Data
May 15, 2013 (EP) .................................... 13167872

(51) Int. Cl.
| C09K 13/06 | (2006.01) |
| H01L 21/306 | (2006.01) |
| C09G 1/02 | (2006.01) |
| C09K 3/14 | (2006.01) |
| H01L 21/321 | (2006.01) |

(52) U.S. Cl.
CPC .......... *H01L 21/30625* (2013.01); *C09G 1/02* (2013.01); *C09K 3/1436* (2013.01); *C09K 3/1463* (2013.01); *H01L 21/3212* (2013.01); *H01L 21/32115* (2013.01)

(58) Field of Classification Search
CPC ... C09G 1/00; C09G 1/02; C09G 1/04; C09K 13/00; C09K 3/1436; C09K 3/1463; H01L 21/30625; H01L 21/3212; H01L 21/3211; H01L 21/32115; H01L 2224/03616; H01L 2224/03845
USPC .... 252/79.1, 79.2, 79.3, 79.4; 438/692, 693, 438/694
See application file for complete search history.

(56) References Cited

U.S. PATENT DOCUMENTS

| 6,811,583 | B2 | 11/2004 | Ishibashi | |
| 7,842,191 | B2 | 11/2010 | Minamihaba et al. | |
| 8,157,876 | B2 | 4/2012 | Grumbine et al. | |
| 8,337,715 | B2 | 12/2012 | Minamihaba et al. | |
| 2003/0121214 | A1 | 7/2003 | Ishibashi | |
| 2006/0243702 | A1 | 11/2006 | Minamihaba et al. | |
| 2007/0037892 | A1 | 2/2007 | Belov | |
| 2007/0167116 | A1* | 7/2007 | Yoshida | B24B 37/044 451/41 |
| 2007/0169421 | A1* | 7/2007 | Koyama | C09G 1/02 51/298 |
| 2008/0182485 | A1* | 7/2008 | Siddiqui | C09G 1/02 451/36 |
| 2009/0126713 | A1 | 5/2009 | Grumbine et al. | |
| 2009/0261291 | A1* | 10/2009 | Banerjee | C09G 1/02 252/79.1 |
| 2011/0062374 | A1 | 3/2011 | Minamihaba et al. | |
| 2011/0081780 | A1* | 4/2011 | Shida | C09G 1/02 438/693 |
| 2014/0024216 | A1* | 1/2014 | Stender | C09K 3/1436 438/692 |
| 2015/0299517 | A1* | 10/2015 | Matsushita | C09K 3/1409 252/79.1 |

FOREIGN PATENT DOCUMENTS

| CN | 1854225 A | 11/2006 |
| CN | 102257092 A | 11/2011 |
| EP | 2 533 274 A1 | 12/2012 |
| WO | WO 2004/063301 A1 | 7/2004 |
| WO | WO 2006/028759 A2 | 3/2006 |
| WO | WO 2009/024457 A1 | 2/2009 |
| WO | WO 2010/134542 A1 | 11/2010 |

OTHER PUBLICATIONS

International Search Report and Written Opinion dated Jan. 26, 2015 in PCT/IB2014/061200.
Volker Buehler, "Polyvinylpyrrolidone excipients for the pharmaceutical industry", BASF, 9th revised edition, 2008, pp. 26-29.
International Search Report dated Jan. 26, 2015 in PCT/162014/061200.
International Preliminary Report on Patentability and Written Opinion dated Nov. 17, 2015 in PCT/162014/061200.
U.S. Appl. No. 14/890,754, filed Nov. 12, 2015, Lan, et al.

(Continued)

*Primary Examiner* — Lan Vinh
(74) *Attorney, Agent, or Firm* — Oblon, McClelland, Maier & Neustadt, L.L.P.

(57) ABSTRACT

Described is a chemical-mechanical polishing (CMP) composition comprising the following components: (A) surface modified silica particles having a negative zeta potential of −15 mV or below at a pH in the range of from 2 to 6 (B) one or more polymers selected from the group consisting of N-vinyl-homopolymers and N-vinyl copolymers (C) water (D) optionally one or more further constituents, wherein the pH of the composition is in the range of from 2 to 6.

14 Claims, No Drawings

(56) References Cited

OTHER PUBLICATIONS

U.S. Appl. No. 14/770,185, filed Aug. 25, 2015, Lan, et al.
U.S. Appl. No. 14/891,175, filed Nov. 13, 2015, Lan, et al.

* cited by examiner

CHEMICAL-MECHANICAL POLISHING COMPOSITIONS COMPRISING ONE OR MORE POLYMERS SELECTED FROM THE GROUP CONSISTING OF N-VINYL-HOMOPOLYMERS AND N-VINYL COPOLYMERS

FIELD OF THE INVENTION

The present invention relates to a chemical-mechanical polishing composition comprising (A) surface modified silica particles having a negative zeta potential of −15 mV or below at a pH in the range of from 2 to 6 and (B) one or more polymers selected from the group consisting of N-vinyl-homopolymers and N-vinyl copolymers as additive. The present invention also relates to a process for the manufacture of semiconductor devices comprising the chemical-mechanical polishing of a substrate or layer in the presence of said chemical-mechanical polishing (CMP) composition.

DESCRIPTION OF THE PRIOR ART

In the semiconductor industry, chemical mechanical polishing is a well-known technology applied in fabricating advanced photonic, microelectromechanical and microelectronic materials and devices, such as semiconductor wafers.

During the fabrication of materials and devices used in the semiconductor industry, CMP is employed to planarize surfaces. CMP utilizes the interplay of chemical and mechanical action to achieve the planarity of the to-be-polished surfaces. Chemical action is provided by a chemical composition, also referred to as CMP composition or CMP slurry. Mechanical action is usually carried out by a polishing pad which is typically pressed onto the to-be-polished surface and mounted on a moving platen. The movement of the platen is usually linear, rotational or orbital.

In a typical CMP process step, a rotating wafer holder brings the to-be-polished wafer in contact with a polishing pad. The CMP composition is usually applied between the to-be-polished wafer and the polishing pad.

In the state of the art, CMP processes in the presence of a CMP composition comprising surface modified silica particles are known and described, for instance, in the following references.

WO 2006/028759 A2 describes an aqueous slurry composition for polishing/planarization substrates which are utilized in the process of metal interconnect formation on IC devices. Said slurry comprising silicon dioxide abrasive particles wherein said abrasive particles are anionically modified/doped with metallate anions selected from the group consisting of aluminate, stannate, zincate and plumbate, thereby providing a high negative surface charge to said abrasive particles and enhancing the stability of said slurry composition.

EP 2 533 274 A1 discloses a chemical mechanical polishing aqueous dispersion comprising (A) silica particles that include at least one functional group selected from a group consisting of a sulfo group and salts thereof, and (B) an acidic compound.

OBJECTS OF THE INVENTION

One of the objects of the present invention is to provide a CMP composition and a CMP process especially for the chemical-mechanical polishing of III-V materials, particularly GaAs and InP substrates which are utilized in the front-end-of-line (FEOL) IC production to form transistors, and showing an improved polishing performance, especially (i) a high material removal rate (MRR) of a III-V material, for example GaAs and/or InP,
(ii) an adjustable selectivity between different III-V materials (i.e. a high ratio between the material removal rates of said different III-V materials), e.g. a high selectivity of GaAs over InP,
(iii) high surface quality of the III-V material, for example GaAs and/or InP, after the CMP step,
(iv) safe handling and reduction of hazardous by-products—for example the toxic gasses $AsH_3$ and/or $PH_3$ in case of polishing GaAs and/or InP—to a minimum, or
(v) or the combination of (i), (ii), (iii) and (iv).

Moreover, a CMP process was sought that is easy to apply and requires as few steps as possible.

SUMMARY OF THE INVENTION

According to a first aspect of the present invention, a chemical-mechanical polishing (CMP) composition is provided comprising the following components:
(A) surface modified silica particles having a negative zeta potential of −15 mV or below at a pH in the range of from 2 to 6,
(B) one or more polymers selected from the group consisting of N-vinyl-homopolymers and N-vinyl copolymers
(C) water,
(D) optionally one or more further constituents,
wherein the pH of the composition is in the range of from 2 to 6.

In a further aspect, the present invention relates to the use a polymer selected from the group consisting of N-vinyl-homopolymers and N-vinyl copolymers as an additive for a chemical-mechanical polishing (CMP) composition, preferably as an additive for a chemical-mechanical polishing (CMP) composition comprising surface modified silica particles having a negative zeta potential of −15 mV or below at a pH in the range of from 2 to 6.

Preferably the polymer selected from the group consisting of N-vinyl-homopolymers and N-vinyl copolymers has an average molecular weight in the range of from 3000 g/mol to 100000 g/mol.

A preferred use according to the invention is the use of a polymer selected from the group consisting of N-vinyl-homopolymers and N-vinyl copolymers, wherein the additive is an additive for selective polishing of a III-V material, wherein the III-V material is preferably selected from the group consisting of GaN, GaP, GaAs, GaSb, AlAs, AlN, InP, InAs, InSb, InGaAs, InAlAs, AlGaAs, GaAlIN, GaInN, InGaAlAs, InGaAsP, InGaP, AlInP, GaAlSb, GaInSb, GaAlAsSb, and GaInAsSb.

According to a further aspect of the invention there is provided a process for the manufacture of semiconductor devices comprising the chemical-mechanical polishing of a substrate or layer in the presence of a chemical-mechanical polishing (CMP) composition as defined hereinabove or hereinbelow.

Generally, the semiconductor device which can be manufactured by the process according to the invention is not particularly limited. Thus the semiconductor devices can be electronic components comprising semiconducting materials, as for example silicon, germanium, and III-V materials. Semiconductor devices can be those which are manufactured as single discrete devices or those which are manufactured as integrated circuits (ICs) consisting of a number of devices manufactured and interconnected on a wafer.

Semiconductor devices can be two terminal devices for example a diode, three terminal devices for example a bipolar transistor, four terminal devices for example a Hall effect sensor or multi-terminal devices. Preferably, said semiconductor device is a multi-terminal device. Multi-terminal devices can be logic devices as integrated circuits and microprocessors or memory devices as random access memory (RAM), read only memory (ROM) and phase change random access memory (PCRAM). Preferably said semiconductor device is a multi-terminal logic device. In particular said semiconductor device is an integrated circuit or microprocessor.

In a further aspect, the present invention relates to the use of a chemical-mechanical polishing (CMP) composition as defined hereinabove or hereinbelow for polishing a substrate or layer containing one or more III-V materials wherein the one or at least one of or all III-V materials are preferably selected from the group consisting of GaN, GaP, GaAs, GaSb, AlAs, AlN, InP, InAs, InSb, InGaAs, InAlAs, AlGaAs, GaAlN, GaInN, InGaAlAs, InGaAsP, InGaP, AlInP, GaAlSb, GaInSb, GaAlAsSb, and GaInAsSb.

Preferred embodiments are explained in the claims and the specification. It is understood that combinations of preferred embodiments are within the scope of the present invention.

In a preferred process according to the present invention the substrate or layer contains one or more III-V materials. Preferably the one, at least one of or all the III-V materials are selected from the group consisting of GaN, GaP, GaAs, GaSb, AlAs, AlN, InP, InAs, InSb, InGaAs, InAlAs, AlGaAs, GaAlN, GaInN, InGaAlAs, InGaAsP, InGaP, AlInP, GaAlSb, GaInSb, GaAlAsSb and GaInAsSb.

A semiconductor device can be manufactured by the process of the invention. Said process preferably comprises the chemical mechanical polishing of a substrate or layer— preferably a layer—containing one or more III-V materials in the presence of the CMP composition as defined hereinabove or hereinbelow.

If the III-V material has the shape of a layer, the content of all III-V material contained in the layer is preferably more than 90%, more preferably more than 95%, most preferably more than 98%, particularly more than 99%, for example more than 99.9% by weight of the corresponding layer. A III-V material is a material consisting of at least one group 13 element (including Al, Ga, In) and at least one group 15 element (including N, P, As, Sb). The terms "group 13" and "group 15" refer to the current IUPAC convention for naming the groups in the periodic table of chemical elements. Preferably, said III-V material is GaN, GaP, GaAs, GaSb, AlAs, AlN, InP, InAs, InSb, InGaAs, InAlAs, AlGaAs, GaAlN, GaInN, InGaAlAs, InGaAsP, InGaP, AlInP, GaAlSb, GaInSb, GaAlAsSb, or GaInAsSb. More preferably, said III-V material is GaN, GaP, GaAs, GaSb, InP, InAs, InSb, InGaAs, or InAlAs. Most preferably, said III-V material is GaN, GaP, GaAs, GaAs, InP, or InAs. Particularly, said III-V material is GaAs (gallium arsenide) and/or InP (indium phosphide).

The CMP composition of the present invention is used for chemical-mechanical polishing of a substrate or layer— preferably a layer—containing one or more III-V materials, preferably for chemical-mechanical polishing of a layer containing one or more III-V materials. If the III-V material has the shape of a layer, the content of all III-V material contained in the layer is preferably more than 90%, more preferably more than 95%, most preferably more than 98%, particularly more than 99%, for example more than 99.9% by weight of the corresponding layer. Preferably, said III-V material is GaN, GaP, GaAs, GaSb, AlAs, AlN, InP, InAs, InSb, InGaAs, InAlAs, AlGaAs, GaAlN, GaInN, InGaAlAs, InGaAsP, InGaP, AlInP, GaAlSb, GaInSb, GaAlAsSb, or GaInAsSb. More preferably, said III-V material is GaN, GaP, GaAs, GaSb, InP, InAs, InSb, InGaAs, or InAlAs. Most preferably, said III-V material is GaN, GaP, GaAs, GaAs, InP, or InAs. Particularly, said III-V material is GaAs (gallium arsenide) and/or InP (indium phosphide).

The CMP composition of the present invention comprises the components (A), (B), and (C) water and optionally further component (D) as described below.

Component (A): surface modified silica particles having a negative zeta potential of −15 mV or below at a pH in the range of from 2 to 6

The surface-modified silica particles have a zeta potential more negative than −15 mV, preferably, more negative than −25 mV, and most preferably more negative than −30 mV.

The surface modified silica particles are silica particles, preferably colloidal silica particles which are stabilized as the result of changes of the surface of the particles. The surface-modified silica particles are preferably amorphous and not agglomerated and thus typically occur in the form of discrete spheres that are not crosslinked with each other and contain hydroxyl groups on the surface. Colloidal silica particles are obtainable by methods known in the art such as ion-exchange of silicic acid salt, or by sol-gel technique (e.g., hydrolysis or condensation of a metal alkoxide, or peptization of precipitated hydrated silicon oxide, etc.).

Preferably the surface modified silica particles of component (A) having a negative zeta potential of −15 mV or below at a pH in the range of from 2 to 6 are silica particles anionically modified with metallate ions or modified with sulfonic acid.

Sulfonic acid-modified aqueous anionic silica sols which are highly stable under acidic conditions are disclosed e.g. in WO 2010734542 A1. Herein, a sulfonic acid-modified aqueous anionic silica sol is obtained by a method wherein a silane coupling agent having a functional group which can be chemically converted into a sulfonic acid group is added to colloidal silica, and then the functional group is converted into a sulfonic acid group.

The term "anionically modified with metallate ions" as utilized herein in particular refers to silica particles where metallate ions (i.e., $M(OH)_4^-$) are incorporated in the surface of the silica particle replacing $Si(OH)_4$ sites and creating a permanent negative charge, as explained in WO 2006/028759 A2.

Preferably the surface modified silica particles of component (A) having a negative zeta potential of −15 mV or below at a pH in the range of from 2 to 6 are silica particles anionically modified with metallate ions selected from the group consisting of aluminate, stannate, zincate, and plumbate.

Most preferably the surface modified silica particles of component (A) having a negative zeta potential of −15 mV or below at a pH in the range of from 2 to 6 are silica particles anionically modified with aluminate. Such surface modified silica particles are disclosed e.g. in WO 2006/7028759 A2.

Generally, the particles (A) can be contained in varying amounts in the CMP composition of the present invention. Preferably, the amount of (A) is not more than 30 wt. % (wt. % in each case stands for "percent by weight"), more preferably not more than 5 wt. %, most preferably not more than 3 wt. %, particularly preferably not more than 2.5 wt. %, for example not more than 1.5 wt. %, in each case based on the total weight of the composition of the present invention. Preferably, the amount of (A) is at least 0.1 wt. %, particularly at least 0.4 wt. %, for example 1 wt. %, in each case based on the total weight of the composition of the present invention.

Generally, the particles (A) can be contained in varying particle size distributions. The particle size distributions of the particles (A) can be monomodal or multimodal. In case of multimodal particle size distributions, bimodal is often preferred. In order to have an easily reproducible property profile and easily reproducible conditions during the CMP process of the invention, a monomodal particle size distribution is preferred for (A). It is most preferred for (A) to have a monomodal particle size distribution.

The average particle size of the surface-modified silica is preferably in the range of from 1 to 200 nm, preferably of from 5 to 140 nm, and most preferably of from 10 to 100 nm. The term "particle size" as utilized herein refers to the average diameter of particles as measured by standard particle sizing instruments and methods, such as dynamic light scattering techniques, laser diffusion diffraction techniques, ultracentrifuge analysis techniques, etc. If not indicated otherwise dynamic light scattering techniques are preferred.

The BET surface determined according to DIN ISO 9277 of the silica particles can vary within a wide range. Preferably, the BET surface of the silica particles is in the range of from 1 to 500 $m^2/g$, more preferably in the range of from 5 to 350 $m^2/g$, most preferably in the range of from 10 to 300 $m^2/g$, in particular in the range of from 50 to 250 $m^2/g$, for example in the range of from 100 to 220 $m^2/g$.

Component (B): One or more polymers selected from the group consisting of N-vinyl-homopolymers and N-vinyl copolymers As component (B) the CMP composition of the present invention comprises one or more polymers selected from the group consisting of N-vinyl-homopolymers and N-vinyl copolymers.

In the context of the present invention the term "N-vinyl-homopolymers" indicates homopolymers obtainable by polymerization of an N-vinyl-monomer, and the term "N-vinyl-copolymers" indicates copolymers obtainable by copolymerization of a N-vinyl monomer with (i) one or more other N-vinyl monomers or (ii) one or more monomers which are not N-vinyl monomers or (iii) one or more other N-vinyl monomers and one or more monomers which are not N-vinyl monomers. Preferably, the N-vinyl monomer and/or one or more of the other N-vinyl monomers are selected from the group consisting of N-vinylamides, N-vinylamines and N-vinyllactams.

Preferred polymers are those obtainable from one or more monomers a), optionally one or more monomers b), and optionally one or more crosslinking monomers c), i.e. they are obtained by polymerization of said monomers and can also comprise residual amounts of said monomers.

Suitable monomers a) are, for example:

N-vinyllactams, such as N-vinylpyrrolidone, N-vinylpiperidone, N-vinylcaprolactam, derivatives thereof substituted with C1- to C8-alkyl groups, such as 3-methyl-, 4-methyl- or 5-methyl-N-vinylpyrrolidone.

N-Vinylamides, such as N-vinylformamide and the N-vinylamine thereof obtainable following polymerization by hydrolysis, N-vinyl-N-methylacetamide.

N-vinylamines, such as N-vinyl-substituted heterocyclic compounds, preferably N-vinylpyridine, N-vinylimidazoles, which may also be substituted in the 2-, 4- or 5-position with C1-C4-alkyl, in particular methyl or phenyl radicals, such as 1-vinylimidazole, 1-vinyl-2-methylvinylimidazole, and quaternized analogs thereof, such as 3-methyl-1-vinylimidazolium chloride, 3-methyl-1-vinylimidazolium methylsulfate.

As mentioned above polymers (B) to be used according to the invention may be homopolymers and also copolymers of two or more of the monomers a), for example copolymers of N-vinylpyrrolidone and N-vinylimidazole, copolymers of N-vinylpyrrolidone and N-vinylformamide or copolymers of N-vinylpyrrolidone and N-vinylcaprolactam.

Preferred monomers a) are vinyllactams such as N-vinylpyrrolidone, 3-methyl-N-vinylpyrrolidone, 4-methyl-N-vinylpyrrolidone, 5-methyl-N-vinylpyrrolidone, N-vinylpiperidone and N-vinylcaprolactam, vinyl acetate, and also the vinyl alcohol obtainable by hydrolysis after the polymerization, vinylamides such as vinylformamide, and also the vinylamine obtainable by hydrolysis after the polymerization, N-vinylimidazole, 1-vinyl-3-methylimidazolium chloride, 1-vinyl-3-methylimidazolium sulfate, and vinyl methylacetamide, and derivatives thereof.

Very particularly preferred monomers a) are N-vinylpyrrolidone, N-vinylcaprolactam, vinyl acetate, vinylformamide, and also the vinylamine obtainable by hydrolysis after the polymerization or N-vinylimidazole.

Suitable monomers b) are acrylic acids and derivatives thereof, such as substituted acrylic acids, and also salts, esters and amides thereof, where the substituents are on the carbon atoms in the 2- or 3-position of the acrylic acid and are selected independently of one another from the group consisting of C1-C4-alkyl, —CN and —COOH.

Preferred monomers b) are maleic acid, maleic anhydride, isopropylmethacrylamide, acrylamide, methacrylamide, 2-hydroxyethylacrylamide and 2-hydroxyethylmethacrylamide, also vinyl esters of aliphatic C2-C18-carboxylic acids, such as vinyl acetate, and also the vinyl alcohol obtainable by hydrolysis after the polymerization, vinyl propionate, vinyl butyrate, vinyl laurate, vinyl stearate, vinyl neodecanoate VEOVA 9 and VEOVA 10, also dimethylaminoethyl (meth)acrylate and dimethylaminoethyl(meth)acrylamide or quaternized analogs thereof, and also diallyldimethylammonium chloride.

Very particularly preferred monomers b) are methacrylamide, vinyl acetate, and also the vinyl alcohol obtainable by hydrolysis after the polymerization, vinyl propionate, vinyl neodecanoate VEOVA 9 and VEOVA 10, dimethylaminoethyl(meth)acrylate or dimethylaminoethyl(meth) acrylamide or quaternized analogs thereof, and also diallyldimethylammonium chloride.

Polymers which are copolymers and comprise monomers b) can comprise one or more of the monomers b). Usually, however, not more than five different monomers b) are present in one copolymer.

Preferred polymers further include copolymers which comprise one or more monomers a) and one or more monomers b).

Suitable crosslinking monomers c) ("crosslinkers") are crosslinking monomer c) are described for example in WO2009/024457 on page 7, line 1 to page 9, line 2, to which reference is hereby expressly made.

Particularly preferred crosslinking monomers c) are pentaerythritol triallyl ether, methylenebisacrylamide, N,N'-divinylethylene urea, divinylbenzene, ethylene bis-N-vinylpyrrolidone, 3-vinyl-N-vinylpyrrolidone, 4-vinyl-N-vinylpyrrolidone, 5-vinyl-N-vinylpyrrolidone, allyl(meth)acrylate, triallylamine and acrylic acid esters of glycol, butanediol, trimethylolpropane or glycerol, and also acrylic acid esters of glycol, butanediol, trimethylolpropane or glycerol reacted with ethylene oxide and/or epichlorohydrin.

Crosslinking monomers c) particularly preferred for the use for the so-called popcorn polymerization are N,N'-divinylethylene urea, ethylene bis-N-vinylpyrrolidone, 3-vinyl-N-vinylpyrrolidone, 4-vinyl-N-vinylpyrrolidone, 5-vinyl-N-vinylpyrrolidone, of which very particular preference is given to N,N'-divinylethylene urea.

The quantitative fractions in percent by weight based on the total mass of the polymer are here for the monomers a) usually at least 20, preferably at least 30, particularly preferably at least 50, especially preferably at least 60 percent by weight and very especially preferably up to 100 percent by weight, such as, for example, homopolymers of 100% of a monomer a).

The quantitative fractions in percent by weight based on the total mass of the polymer are here for the monomers b) usually up to 80, preferably up to 70, particularly preferably up to 50, especially preferably up to 40 and very especially preferably less than 5 percent by weight and are, for example, not present at all in the polymer.

If the polymer is water-solubly crosslinked polymer, the quantitative fractions of the crosslinking monomers c) in percent by weight based on the total mass of the polymer are usually 0.001 to 20, preferably 0.01 to 10, particularly preferably 0.05 to 5 and especially 0.1 to 1 percent by weight. If a crosslinking monomer c) is used, then the quantitative fractions of monomer a) and/or monomer b) are reduced accordingly by the amount of crosslinking monomer c) used. The total amounts of monomer a), monomer b) and monomers c) always add up here to 100 percent by weight.

The monomers a), b) and c) used for the polymerization may, independently of one another, be an individual or mixtures of two or more monomers a), monomers b) and/or monomers c), where the combined quantitative fraction of the monomers a), b) or c) gives the quantitative fraction specified in each case for monomer a), for monomer b) or for monomer c), respectively, in the polymer.

A vinyllactam polymer may be a homopolymer or copolymer comprising N-vinyllactams, such as N-vinylpyrrolidone (VP) or derivatives thereof methyl-substituted in the 3-, 4- or 5-position, N-vinylpiperidone or N-vinylcaprolactam (VCap). Preference is given to N-vinylpyrrolidone, N-vinylcaprolactam or mixture thereof. Particular preference is given to N-vinylpyrrolidone.

Preferred vinyllactam polymers are vinylpyrrolidone polymers, such as polyvinylpyrrolidones and vinylpyrrolidone copolymers.

Preferred polyvinylpyrrolidones are polymers with K values of from 1 to 150, preferably K10 to K120, for example K12, K15, K 17, K25, K30, K60, K85, K90, K95, K100, K115 or K120. Particularly preferred PVP homopolymers have a K value of from 12 to 95 and particularly preferably from 15 to 40.

Preferred vinylpyrrolidone copolymers are linear, uncrosslinked copolymers with N-vinylcaprolactam (VCap), vinyl acetate (VAc), N-vinylimidazole (VI) or derivatives thereof or mixtures thereof.

Very particularly preferred copolymers are copolymers of N-vinylpyrrolidone (VP) with vinyl acetate having a VP/VAc weight ratio of from 20:80 to 80:20, for example 30:70, 50:50, 60:40, 70:30, with K values of from 10 to 150, preferably from 15 to 80 and in particular from 20 to 50. Particularly preferred copolymers of N-vinylpyrrolidone with vinyl acetate have a K value of from 25 to 50 and a weight ratio of VP to VAc of from 55:45 to 70:30.

Preference is likewise given to copolymers of VP and VI and also copolymers of VP and VCap, in each case having K values of from 10 to 100, preferably from 12 to 80 and in particular from 20 to 75, and also weight ratios of the monomers VP to VI or VP to VCap of from 80:20 to 20:80, preferably from 70:30 to 30:70, especially preferably from 60:40 to 40:60 and for example also 50:50.

The K value is determined here in accordance with Fikentscher (see Volker Bühler in "Polyvinylpyrrolidone excipients for the pharmaceutical industry", 9. revised edition, BASF, page 26 to 29).

Preference is also given to copolymers of VP and 1-vinyl-3-methylimidazolium chloride or 1-vinyl-3-methylimidazolium sulfate ("QVI"; obtained by quaternization of 1-vinylimidazole with methyl chloride or dimethyl sulfate) having a weight ratio of VP/QVI of from 20:80 to 99:1, where the copolymers can have molecular weights Mw of from 10 000 to greater than 1 000 000 daltons (determined by means of GPC).

The preparation of N-vinyllactam polymers by free-radical polymerization is known per se. The free-radical polymerization can also take place in the presence of customary crosslinkers and in this case produces branched or crosslinked polymers which are water-soluble to gel-forming in water depending on the degree of crosslinking.

The preparation of water-soluble polyvinylpyrrolidones can take place for example as solution polymerization in a suitable solvent such as water, mixtures of water and organic solvents, for example ethanol/water or isopropanol/water mixtures or in purely organic solvents such as methanol, ethanol or isopropanol. These preparation methods are known to the person skilled in the art.

As used herein, the term "polymer" comprises for example water-soluble linear and branched polymers. Within the context of this invention, "branched", "branching", "crosslinked", "crosslinking" are used exchangeably and means polymer which has at least one branching point. "Polymer" also comprises the copolymers, graft homopolymers or graft copolymers, each of which may be present as linear or solubly crosslinked, in particular water-solubly crosslinked polymers. "Polymer" may also be present in the form of di- or multi-block polymers. It may likewise be present in star, brush or hyperbranched form or as dendrimer.

Also comprised are water soluble polyether-containing copolymers of one or more N-vinyl monomers. Examples thereof are polyether-containing graft polymers of polyethers and vinyllactams such as N-vinylpyrrolidone (NVP) and/or N-vinylamines, such as N-vinylimidazole (VI).

Generally, the polymers (B) can be contained in varying amounts in the CMP composition of the present invention. Preferably, the total amount of polymers (B) is not more than 3 wt. % (wt. % in each case stands for "percent by weight"), more preferably not more than 2 wt. %, most preferably not more than 1 wt. %, particularly preferably not more than 0.5 wt. %, in each case based on the total weight of the composition of the present invention. Preferably, the total amount of polymers (B) is at least 0.01 wt. %, particularly at least 0.05 wt. %, for example 0.1 wt. %, in each case based on the total weight of the composition of the present invention.

Generally, the polymers (B) can have different weight average molecular weights. The weight average molecular weight of the one, at least one or all polymers (B) is preferably at least 3000 g/mol, further preferably at least 6000 g/mol, more preferably at least 8000 g/mol. The weight average molecular weight of the one, at least one or all polymers (B) is preferably not more than 100000 g/mol, further preferably not more than 90000 g/mol, more preferably not more than 75,000 g/mol, as determined in each case by gel permeation chromatography (abbreviated as "GPC" in the following). Said GPC are standard GPC techniques known to the person skilled of the art. Most preferably, the average molecular weight of (B) is in the range of 9000 g/mol to 70000 g/mol as determined in each case by gel permeation chromatography.

In preferred CMP compositions according to the present invention, the polymer (B) is selected from the group consisting of N-vinylpyrrolidone polymers and N-vinylpyrrolidone/N-vinylimidazole copolymers. "N-vinylpyrrolidone/N-vinylimidazole copolymers" are copolymers obtainable by co-polymerization of N-vinylpyrrolidone and N-vinylimidazole and optionally further monomers. "N-vinylpyrrolidone polymers" are obtainable by homopolymerization of N-vinylpyrrolidone.

Optional Further Constituents (D)

A CMP composition according to the present invention may comprise further constituents, depending on the specific requirements of the intended use of said CMP composition. Preferably the one or at least one of or all of the further constituents of component (D) are selected from the group consisting of oxidizing agents, abrasive materials different from surface modified silica particles having a negative zeta potential of −15 mV or below at a pH in the range of from 2 to 6, stabilizers, surfactants, friction reducing agents, buffer substances.

The CMP composition of the present invention can further optionally comprise one or more types of oxidizing agent (D1), preferably one to two types of oxidizing agent (D1), more preferably one type of oxidizing agent (D1). The oxidizing agent (D1) is different from the components (A), (B) and (C) water. In general, the oxidizing agent is a compound which is capable of oxidizing the to-be-polished substrate or one of its layers. Preferably, (D1) is a per-type oxidizer. More preferably, (D1) is a peroxide, persulfate, perchlorate, perbromate, periodate, permanganate, or a derivative thereof. Most preferably, (D1) is a peroxide or persulfate. Particularly, (D1) is a peroxide. For example, (D1) is hydrogen peroxide.

If present, the oxidizing agent (D1) can be contained in varying amounts in the CMP composition of the present invention. Preferably, the amount of (D1) is not more than 20 wt. % (wt. % in each case stands for "percent by weight"), more preferably not more than 10 wt. %, most preferably not more than 5 wt. %, particularly not more than 3.5 wt. %, for example not more than 2.7 wt. %, in each case based on the total weight of the CMP composition of the present invention. Preferably, the amount of (D1) is at least 0.01 wt. %, more preferably at least 0.08 wt. %, most preferably at least 0.4 wt. %, particularly at least 0.75 wt. %, for example at least 1 wt. %, in each case based on the total weight of the composition of the present invention. If hydrogen peroxide is used as oxidizing agent (D1), the amount of (D1) is preferably 1 wt. % to 5 wt. %, more preferably 2 wt. % to 3.5 wt. %, for instance 2.5 wt. %, in each case based on the total weight of the CMP composition of the present invention.

The CMP composition of the present invention can further optionally contain one or more biocides (D2), for example one biocide. The biocide (D2) is different from the components (A), (B), (C) and from constituent (D1) of component (D). In general, the biocide is a compound which deters, renders harmless or exerts a controlling effect on any harmful organism by chemical or biological means. Preferably, (D2) is an quaternary ammonium compound, an iso-thiazolinone-based compound, an N-substituted diazenium dioxide, or an N'-hydroxy-diazenium oxide salt. More preferably, (D2) is an N-substituted diazenium dioxide, or an N'-hydroxy-diazenium oxide salt If present, the biocide (D2) can be contained in varying amounts in the CMP composition of the present invention. If present, the amount of (D2) is preferably not more than 0.5 wt. % (wt. % in each case stands for "percent by weight"), more preferably not more than 0.1 wt. %, most preferably not more than 0.05 wt. %, particularly not more than 0.02 wt. %, for example not more than 0.008 wt. %, in each case based on the total weight of the corresponding composition. If present, the amount of (D2) is preferably at least 0.0001 wt. %, more preferably at least 0.0005 wt. %, most preferably at least 0.001 wt. %, particularly at least 0.003 wt. %, for example at least 0.006 wt. %, in each case based on the total weight of the corresponding CMP composition of the present invention.

The CMP composition of the present invention can further optionally contain one or more corrosion inhibitors (D3), for example one corrosion inhibitor. The corrosion inhibitor (D3) is different from the components (A), (B), (C) and from constituents (D1) and (D2) of component (D). In general, all compounds forming a protective molecular layer on the surface of a III-V material—for example GaAs—can be used as corrosion inhibitor. Suitable corrosion inhibitors are known in the art.

If present, the corrosion inhibitor (D3) can be contained in varying amounts in the CMP composition of the present invention. If present, the amount of (D3) is preferably not more than 10 wt. % (wt. % in each case stands for "percent by weight"), more preferably not more than 2 wt. %, most preferably not more than 0.5 wt. %, particularly not more than 0.1 wt. %, for example not more than 0.05 wt. %, in each case based on the total weight of the corresponding composition. If present, the amount of (D3) is preferably at least 0.0005 wt. %, more preferably at least 0.005 wt. %, most preferably at least 0.025 wt. %, particularly at least 0.1 wt. %, for example at least 0.4 wt. %, in each case based on the total weight of the composition of the present invention.

The properties of the CMP composition of the present invention, such as stability and polishing performance, may depend on the pH of the corresponding composition. The pH value of the CMP composition of the present invention is in the range of from 2 to 6 preferably from 2.2 to 6, more preferably from 2.5 to 5.8, further preferably from 2.5 to 5.5, still further preferably from 2.8 to 5.5, especially preferably from 3 to 5.2, particularly preferably from 3 to 5, more particular preferably from 3.2 to 5, particularly from 3.5 to 4.5, for example 4

The CMP composition of the present invention can further optionally contain one or more buffer substances (D4). The buffer substance (D4) is different from the components (A), (B), (C) and from constituents (D1), (D2) and (D3) of component (D). In general, the buffer substance (D4) is a compound which is added to the CMP composition of the present invention to have its pH value adjusted to the required value. Preferred buffer substances are inorganic acids, carboxylic acids, amine bases, alkali hydroxides, ammonium hydroxides, including tetraalkylammonium hydroxides. For example, the buffer substance (D4) is nitric acid, sulfuric acid, ammonia, sodium hydroxide, or potassium hydroxide.

If present, the buffer substance (D4) can be contained in varying amounts in the CMP composition of the present invention. If present, the amount of (D4) is preferably not more than 10 wt. % (wt. % in each case stands for "percent by weight"), more preferably not more than 2 wt. %, most preferably not more than 0.5 wt. %, particularly not more than 0.1 wt. %, for example not more than 0.05 wt. %, in each case based on the total weight of the corresponding composition. If present, the amount of (D4) is preferably at least 0.0005 wt. %, more preferably at least 0.005 wt. %, most preferably at least 0.025 wt. %, particularly at least 0.1 wt. %, for example at least 0.4 wt. %, in each case based on the total weight of the CMP composition of the present invention.

The CMP composition of the present invention may also contain, if necessary, one or more other additives, including but not limited to stabilizers, surfactants, friction reducing agents, etc. Said other additives are different from the components (A) (B), (C), and from constituents (D1), (D2), (D3) and (D4) of component (D). Said other additives are for instance those commonly employed in CMP compositions and thus known to the person skilled in the art. Such addition can for example stabilize the dispersion, or improve the polishing performance, or the selectivity between different layers.

If present, said other additive can be contained in varying amounts in the CMP composition of the present invention. Preferably, the total amount of said other additives is not more than 10 wt. % (wt. % in each case stands for "percent by weight"), more preferably not more than 2 wt. %, most preferably not more than 0.5 wt. %, particularly not more than 0.1 wt. %, for example not more than 0.01 wt. %, in each case based on the total weight of the corresponding CMP composition. Preferably, the total amount of said other additives is at least 0.0001 wt. %, more preferably at least 0.001 wt. %, most preferably at least 0.008 wt. %, particularly at least 0.05 wt. %, for example at least 0.3 wt. %, in each case based on the total weight of the corresponding CMP composition of the present invention.

Preferably, the chemical-mechanical polishing (CMP) composition does not comprise any abrasive materials different from above-defined surface modified silica particles having a negative zeta potential of −15 mV or below at a pH in the range of from 2 to 6.

A preferred CMP composition according to the present invention comprises
(A) surface modified silica particles having a negative zeta potential of −15 mV or below at a pH in the range of from 2 to 6,
(B) one or more N-vinylpyrrolidone polymers (homopolymers of N-vinylpyrrolidone).

Another preferred CMP composition according to the present invention comprises
(A) surface modified silica particles having a negative zeta potential of −15 mV or below at a pH in the range of from 2 to 6,
(B) one or more N-vinylpyrrolidone/N-vinylimidazole copolymers (copolymers of N-vinylpyrrolidone and N-vinylimidazole and optionally further monomers)

Particularly preferred is a chemical-mechanical polishing (CMP) composition according to the present invention wherein
the total amount of (A) surface modified silica particles having a negative zeta potential of −15 mV or below at a pH in the range of from 2 to 6 is in the range of from 0.01 to 30 wt. % based on the total weight of the CMP composition.
and/or
the total amount of (B) polymers selected from the group consisting of N-vinyl-homopolymers and N-vinyl copolymers is in the range of from 0.01 to 3 wt % based on the total weight of the CMP composition.

Further particularly preferred is a chemical-mechanical polishing (CMP) composition according to the present invention wherein
the surface modified silica particles of component (A) having a negative zeta potential of −15 mV or below at a pH in the range of from 2 to 6 are silica particles anionically modified with aluminate or modified with sulfonic acid,
and/or
the one, at least one or all polymers (B) have an average molecular weight in the range of from 3000 g/mol to 100000 g/mol.

It is understood that the above-defined preferred CMP compositions of the present invention have a pH of from 2 to 6 as described above.

Processes for preparing CMP compositions are generally known. These processes may be applied to the preparation of the CMP composition of the present invention. This can be carried out by dispersing or dissolving the above-described components (A) and (B), and if appropriate the optional further constituents of component (D) in water, and optionally by adjusting the pH value through adding a buffer substance (D4) as defined hereinabove or hereinbelow. For this purpose the customary and standard mixing processes and mixing apparatuses such as agitated vessels, high shear impellers, ultrasonic mixers, homogenizer nozzles or counterflow mixers, can be used.

The CMP composition of the present invention is preferably prepared by dispersing the particles (A), dispersing and/or dissolving (B) one or more polymers selected from the group consisting of N-vinyl-homopolymers and N-vinyl copolymers and optionally dispersing and/or dissolving the further constituents (D) in water (C).

The polishing process is generally known and can be carried out with the processes and the equipment under the conditions customarily used for the CMP in the fabrication of wafers with integrated circuits. There is no restriction on the equipment with which the polishing process can be carried out.

As is known in the art, typical equipment for the CMP process consists of a rotating platen which is covered with a polishing pad. Also orbital polishers have been used. The wafer is mounted on a carrier or chuck. The side of the wafer being processed is facing the polishing pad (single side polishing process). A retaining ring secures the wafer in the horizontal position.

Below the carrier, the larger diameter platen is also generally horizontally positioned and presents a surface parallel to that of the wafer to be polished. The polishing pad on the platen contacts the wafer surface during the planarization process.

To produce material loss, the wafer is pressed onto the polishing pad. Both the carrier and the platen are usually caused to rotate around their respective shafts extending perpendicular from the carrier and the platen. The rotating carrier shaft may remain fixed in position relative to the rotating platen or may oscillate horizontally relative to the platen. The direction of rotation of the carrier is typically, though not necessarily, the same as that of the platen. The speeds of rotation for the carrier and the platen are generally, though not necessarily, set at different values. During the CMP process of the invention, the CMP composition of the present invention is usually applied onto the polishing pad as a continuous stream or in dropwise fashion. Customarily, the temperature of the platen is set at temperatures of from 10 to 70° C.

The load on the wafer can be applied by a flat plate made of steel for example, covered with a soft pad that is often called backing film. If more advanced equipment is being used a flexible membrane that is loaded with air or nitrogen pressure presses the wafer onto the pad. Such a membrane carrier is preferred for low down force processes when a hard polishing pad is used, because the down pressure distribution on the wafer is more uniform compared to that of a carrier with a hard platen design. Carriers with the option to control the pressure distribution on the wafer may also be used according to the invention. They are usually designed with a number of different chambers that can be loaded to a certain degree independently from each other.

For further details reference is made to WO 2004/063301 A1, in particular page 16, paragraph [0036] to page 18, paragraph [0040] in conjunction with the FIG. 2.

By way of the CMP process of the invention, wafers with integrated circuits comprising a dielectric layer can be obtained which have an excellent functionality, especially when the substrate or layer to be polished contains one or more III-V materials.

The CMP composition of the present invention can be used in the CMP process as ready-to-use slurry, they have a long shelf-life and show a stable particle size distribution over long time. Thus, they are easy to handle and to store. They show an excellent polishing performance, particularly with regard to adjustable selectivity and high surface quality combined with minimal generation of the toxic gasses $AsH_3$ and $PH_3$. Since the amounts of its components are held down to a minimum, the CMP composition of the present invention and the CMP process according to the invention can be used or applied in a cost-effective way.

EXAMPLES AND COMPARATIVE EXAMPLES

General Procedure for the CMP Experiments

For the evaluation on benchtop polisher, the following parameters were chosen:

Procedure setting: Phoenix 4000 polisher; table/carrier 200/150 rpm; down force 2.5 psi (17238 Pa); slurry flow rate 18 mL/min; pad IC 1000; time 1 min.

The pad is conditioned by several sweeps, before a new type of CMP composition is used for CMP. For the determination of removal rates at least 3 wafers are polished and the data obtained from these experiments are averaged.

The CMP composition is stirred in the local supply station.

Object to be polished: unstructured GaAs wafers and unstructured InP wafers.

The GaAs material removal rates (referred to as "GaAs-MRR" in the following) for 2 inch (=5.08 cm) discs polished by the CMP composition are determined by difference of weight of the coated wafers or blanket discs before and after CMP, using a Sartorius LA310 S scale. The difference of weight can be converted into the difference of film thickness since the density (5.32 $g/cm^3$ for GaAs) and the surface area of the polished material are known. Dividing the difference of film thickness by the polishing time provides the values of the material removal rate. The InP material removal rates (referred to as "InP-MRR" in the following) were determined in the same manner.

Standard Procedure for Slurry Preparation:

The components (A), (B) and (D1)—each in the amounts as indicated in tables 1 and 2—were dispersed or dissolved in de-ionized water. pH is adjusted by adding of aqueous 10% KOH solution or $HNO_3$ (0.1%-10%) solution to the slurry. The pH value is measured with a pH electrode (Schott, blue line, pH 0-14/−5 . . . 100° C./3 mol/L sodium chloride).

Measurement of the Zeta Potential

For measuring electrophoretic mobility and zeta potential of the silica particles (A) a standard Zetasizer Nano device from the company Malvern was used. The samples were diluted by a factor of 500 with 10 mmol/l KCl solution before measuring the mobility. The measurements were done at 23° C.

Measurement of the K Value

The K value is determined here in accordance with Fikentscher (see Volker Bühler in "Polyvinylpyrrolidone excipients for the pharmaceutical industry", 9th revised edition, BASF, page 26 to 29).

Examples 1 to 4 and Comparative Examples 1-8

In comparative examples 1 to 3 and in examples 1 to 4 according to the invention, the particles (A) are aluminate-modified anionic colloidal silica having a typical particle size of 15 nm, a typical surface area of 200 $m^2/g$ and a zeta potential of −40 mV at pH 4, e.g. Levasil® 200A (from Akzo Nobel).

In comparative examples 4 to 8 the particles (A) are potassium-stabilized colloidal silica particles having a typical particle size of 85 nm, a typical surface area of 35 $m^2/g$ and a zeta potential of −10 mV at pH=4, e.g. NexSil™ 125K.

In example 1 according to the invention and comparative example 5, the additive (B) is a N-vinylpyrrolidone/N-vinylimidazole copolymer having a weight average molar mass (Mw) of 70000 g/mol and a K value of 32, e.g. Sokalan® HP 56 K (from BASF SE).

In example 2 according to the invention and comparative example 6, the additive (B) is a modified N-vinylpyrrolidone/N-vinylimidazole copolymer having a K value of 36, e.g. Sokalan® HP 66 K (from BASF SE).

In example 3 according to the invention and comparative example 7, the additive (B) is a poly-N-vinylpyrrolidone having a weight average molar mass (Mw) of 9000 g/mol and a K value of 16, e.g. Sokalan® HP 165.

In example 4 according to the invention and comparative example 8, the additive (B) is a poly-N-vinylpyrrolidone having a weight average molar mass (Mw) of 40000 g/mol and a K value of 30, e.g. Sokalan® HP 53 from BASF SE.

Aqueous dispersions containing the components (A), (B) and (D1) as listed in tables 1 and 2 were prepared, and the polishing performance data compiled in tables 1 and 2 were determined.

TABLE 1

| | Comparative examples | | | Examples according to the invention | | | |
|---|---|---|---|---|---|---|---|
| | 1 | 2 | 3 | 1 | 2 | 3 | 4 |
| Particles (A) (aluminate-modified silica) | 3.0 wt. % | 3.0 wt. % | 3.0 wt. % | 3.0 wt. % | 3.0 wt. % | 3.0 wt. % | 3.0 wt. % |
| Additive (B) | none | Benzo-triazole, 0.1 wt. % | Tolyl-triazol 0.1 wt. % | N-vinyl-pyrrolidone/ N-vinyl-imidazole copolymer K = 32 0.1 wt. % | N-vinyl-pyrrolidone/ N-vinyl-imidazole copolymer K = 36 0.1 wt. % | Poly-N-vinyl-pyrrolidone K = 16 0.1 wt. % | Poly-N-vinyl-pyrrolidone K = 30 0.1 wt. % |
| Oxidizing agent (D1) | $H_2O_2$ 1.5 wt. % | $H_2O_2$ 1.5 wt. % | $H_2O_2$ 1.5 wt. % | $H_2O_2$ 1.5 wt. % | $H_2O_2$ 1.5 wt. % | $H_2O_2$ 1.5 wt. % | $H_2O_2$ 1.5 wt. % |
| pH | 4 | 4 | 4 | 4 | 4 | 4 | 4 |
| GaAs MRR* (Å/min) | 2149 | 914 | 1511 | 1578 | 1351 | 1592 | 1717 |
| InP MRR (Å/min) | 2551 | 312 | 1118 | 72 | 2180 | 2602 | 2700 |
| MRR(GaAs)/ MRR(InP) | 0.9 | 2.9 | 1.3 | 21.9 | 0.6 | 0.6 | 0.6 |

The data in table 1 show that addition of a polymer selected from the group consisting of N-vinyl-homopolymers and N-vinyl copolymers (additive (B) according to the invention) having varying composition and molecular weight has an effect on the material removal rate (MRR) on both GaAs and InP substrates. Said effect is dependent on the applied additive (B), thus allowing for adjustment of the ratio MRR(GaAs)/MRR(InP) to the specific requirements of the intended application.

Compared with the CM P composition of comparative example 1, which does not contain any polymer (B) and has almost identical material removal rates for GaAs and InP, an increase of the ratio MRR(GaAs)/MRR(InP) to 21 is achieved in the presence of a N-pyrrolidone/N-vinylimidazole copolymer having a weight average molar mass (Mw) of 70000 g/mol in example 1. In examples 2 to 4 due to the presence of other polymers as additive (B) the MRR of GaAs is suppressed while yielding comparable or higher MRR of InP than in comparative example 1, thus resulting in a decrease of the ratio MRR(GaAs)/MRR(InP), compared with comparative example 1

This effect is unique to the combination of the surface-modified silica particles (A) having a negative zeta potential of −15 mV or below at a pH in the range of from 2 to 6 with a polymer (B) selected from the group consisting of N-vinyl-homopolymers and N-vinyl copolymers, as can be seen from comparison examples 4 to 8 (Table 2) which correspond to comparison example 1 and examples 1 to 4 according to the invention with the exception that NexSil™ 125K (potassium-stabilized colloidal silica) is used as particles (A) instead of Levasil® 200 A. Here, the presence of additive polymer (B) in each case results in a suppression of the material removal rates for GaAs and InP.

TABLE 2

| | Comparative Examples | | | | |
|---|---|---|---|---|---|
| | 4 | 5 | 6 | 7 | 8 |
| Particles (A) (potassium-stabilized colloidal silica) | 3.0 wt. % | 3.0 wt. % | 3.0 wt. % | 3.0 wt. % | 3.0 wt. % |
| Additive (B) | none | N-vinyl-pyrrolidone N-vinyl-imidazole copolymer K = 32 0.1 wt. % | N-vinyl-pyrrolidone/ N-vinyl-imidazole copolymer K = 36 0.1 wt. % | Poly-N-vinyl-pyrrolidone K = 16 0.1 wt. % | Poly-N-vinyl-pyrrolidone K = 30 0.1 wt. % |
| Oxidizing agent (D1) | $H_2O_2$ 1.5 wt. % | $H_2O_2$ 1.5 wt. % | $H_2O_2$ 1.5 wt. % | $H_2O_2$ 1.5 wt. % | $H_2O_2$ 1.5 wt. % |
| pH | 4 | 4 | 4 | 4 | 4 |
| GaAs MRR* (Å/min) | 2440 | 1515 | 1290 | 643 | 1049 |
| InP MRR (Å/min) | 1487 | 287 | 263 | 1161 | 1135 |
| MRR(GaAs)/MRR(InP) | 1.6 | 5.3 | 4.9 | 0.5 | 0.9 |

The invention claimed is:

1. A chemical mechanical polishing (CMP) composition comprising the following components:
   (A) from 0.1 to 5 wt. % of surface modified silica particles having a negative zeta potential of −15 mV or below at a pH of from 2 to 6, based on the total weight of the CMP composition,
   (B) from 0.01 to 0.5 wt. % of a polymer consisting of N-vinylpyrrolidone monomers, a copolymer consisting of N-vinylpyrrolidone and N-vinylimidazole monomers, or a combination thereof, based on the total weight of the CMP composition,
   (C) water,
   (D) optionally, one or more further constituents, and hydrogen peroxide,
   wherein the pH of the composition is from 2 to 6, and wherein the surface modified silica particles of the component (A) are silica particles anionically modified with metallate ions or modified with sulfonic acid.

2. The chemical mechanical polishing (CMP) composition according to claim 1, wherein the surface modified silica particles of the component (A) are silica particles anionically modified with metallate ions selected from the group consisting of aluminate, stannate, zincate, and plumbate.

3. The chemical mechanical polishing (CMP) composition according to claim 1, wherein the surface modified silica particles of the component (A) are silica particles anionically modified with aluminate.

4. The chemical mechanical polishing (CMP) composition according to claim 1, wherein the at least one polymer (B) has an average molecular weight in the range of from 3000 g/mol to 100000 g/mol.

5. The chemical mechanical polishing (CMP) composition according to claim 1, wherein
the at least one polymer (B) has an average molecular weight of from 3000 g/mol to 100000 g/mol.

6. The chemical mechanical polishing (CMP) composition according to claim 1, further comprising, as a component (D), at least one component are selected from the group consisting of an oxidizing agent, abrasive material different from the surface modified silica particles (A), stabilizer, surfactant, friction reducing agent, and buffer substance.

7. A method comprising chemical-mechanical polishing a substrate or layer comprising at least one Group III-V material in the presence of the (CMP) composition of claim 1.

8. The method according to claim 4, wherein the at least one Group III-V material is selected from the group consisting of GaN, GaP, GaAs, GaSb, AlAs, AlN, InP, InAs, InSb, InGaAs, InAlAs, AlGaAs, GaAlN, GaInN, InGaAlAs, InGaAsP, InGaP, AlInP, GaAlSb, GaInSb, GaAlAsSb, and GaInAsSb.

9. The method according to claim 7, wherein the at least one Group III-V material is selected from the group consisting of GaN, GaSb, AlAs, AlN, InP, InAs, InSb, InGaAs, InAlAs, AlGaAs, GaAlN, GaInN, InGaAlAs, InGaAsP, InGaP, AlInP, GaAlSb, GaInSb, GaAlAsSb, and GaInAsSb.

10. A process for the manufacture of a semiconductor device comprising chemical-mechanical polishing a substrate or layer in the presence of the chemical-mechanical polishing (CMP) composition of claim 1.

11. The process according to claim 10, wherein the substrate or layer comprises at least one Group III-V material.

12. The process according to claim 11, wherein the at least one Group III-V material is selected from the group consisting of GaN, GaP, GaAs, GaSb, AlAs, AlN, InP, InAs, InSb, InGaAs, InAlAs, AlGaAs, GaAlN, GaInN, InGaAlAs, InGaAsP, InGaP, AlInP, GaAlSb, GaInSb, GaAlAsSb, and GaInAsSb.

13. The process according to claim 11, wherein the at least one Group III-V material is selected from the group consisting of GaN, GaSb, AlAs, AlN, InP, InAs, InSb, InGaAs, InAlAs, AlGaAs, GaAlN, GaInN, InGaAlAs, InGaAsP, InGaP, AlInP, GaAlSb, GaInSb, GaAlAsSb, and GaInAsSb.

14. A process for the manufacture of a semiconductor device comprising chemical-mechanical polishing a substrate or layer in the presence of a chemical-mechanical polishing (CMP) composition comprising the following components:
(A) from 0.1 to 5 wt. % of surface modified silica particles having a negative zeta potential of −15 mV or below at a pH of from 2 to 6, based on the total weight of the CMP composition,
(B) from 0.01 to 0.5 wt. % of at least one polymer selected from the group consisting of a N-vinylpyrrolidone polymer and N-vinylpyrrolidone/N-vinylimidazole copolymer, based on the total weight of the CMP composition,
(C) water,
(D) optionally, one or more further constituents, and hydrogen peroxide,
wherein the pH of the composition is from 2 to 6,
wherein the surface modified silica particles of the component (A) are silica particles anionically modified with metallate ions or modified with sulfonic acid, and
wherein the substrate or layer comprises at least one Group III-V material selected from the group consisting of GaN, GaSb, AlAs, AlN, InP, InAs, InSb, InGaAs, InAlAs, AlGaAs, GaAlN, GaInN, InGaAlAs, InGaAsP, InGaP, AlInP, GaAlSb, GaInSb, GaAlAsSb, and GaInAsSb.

* * * * *

UNITED STATES PATENT AND TRADEMARK OFFICE
CERTIFICATE OF CORRECTION

PATENT NO. : 10,090,159 B2  
APPLICATION NO. : 14/768825  
DATED : October 2, 2018  
INVENTOR(S) : Yongqing Lan et al.

Page 1 of 1

It is certified that error appears in the above-identified patent and that said Letters Patent is hereby corrected as shown below:

On the Title Page

Item (56), OTHER PUBLICATIONS:  
Lines 5-6, "PCT/162014/061200." should read -- PCT/IB2014/061200. --; and  
Line 8, "PCT/162014/061200." should read -- PCT/IB2014/061200. --.

In the Specification

Column 6, Lines 18-19, "vinyl methylacetamide," should read -- vinylmethylacetamide, --.

In the Claims

Column 17, Line 32, Claim 8, "according to claim 4," should read -- according to claim 7, --.

Signed and Sealed this  
Tenth Day of December, 2019

Andrei Iancu  
*Director of the United States Patent and Trademark Office*